(12) United States Patent
Yoshida et al.

(10) Patent No.: US 8,120,123 B2
(45) Date of Patent: Feb. 21, 2012

(54) SEMICONDUCTOR DEVICE AND METHOD OF FORMING THE SAME

(75) Inventors: Makoto Yoshida, Suwon-si (KR); Hyeong-Sun Hong, Seongnam-si (KR); Kye-Hee Yeom, Suwon-si (KR); Dae-Ik Kim, Yongin-si (KR); Yong-Il Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/662,150

(22) Filed: Apr. 1, 2010

(65) Prior Publication Data
US 2010/0193880 A1 Aug. 5, 2010

Related U.S. Application Data

(63) Continuation-in-part of application No. 12/232,498, filed on Sep. 18, 2008.

(30) Foreign Application Priority Data

Sep. 18, 2007 (KR) .......................... 10-2007-0094725
Aug. 26, 2008 (KR) .......................... 10-2008-0083457
Apr. 3, 2009 (KR) .......................... 10-2009-0029012

(51) Int. Cl.
*H01L 23/52* (2006.01)
*H01L 27/088* (2006.01)

(52) U.S. Cl. .................. 257/401; 257/773; 257/E27.06; 257/E23.101

(58) Field of Classification Search .................. 257/401, 257/773, E27.06, E23.141
See application file for complete search history.

(56) References Cited

U.S. PATENT DOCUMENTS

| 5,502,320 | A | 3/1996 | Yamada |
| 5,686,329 | A | 11/1997 | Chang et al. |
| 6,281,540 | B1 | 8/2001 | Aoki |
| 6,429,068 | B1 | 8/2002 | Divakaruni et al. |
| 6,440,783 | B2 | 8/2002 | Wong |
| 6,448,610 | B2 | 9/2002 | Weis |
| 6,828,624 | B1 | 12/2004 | Goda et al. |
| 2001/0025973 | A1 | 10/2001 | Yamada et al. |
| 2006/0284232 | A1 | 12/2006 | Hong et al. |
| 2007/0004119 | A1 | 1/2007 | Chun |
| 2007/0045712 | A1 | 3/2007 | Haller et al. |
| 2007/0278586 | A1 | 12/2007 | Chen et al. |

(Continued)

FOREIGN PATENT DOCUMENTS

JP 07-066297 A 3/1995
(Continued)

*Primary Examiner* — Matthew W Such
*Assistant Examiner* — Monica D Harrison
(74) *Attorney, Agent, or Firm* — Lee & Morse, P.C.

(57) ABSTRACT

A semiconductor device, and a method of forming the same, includes forming a cell bit line pattern and a peripheral gate pattern on a semiconductor substrate. The cell bit line pattern may be formed on an inactive region adjacent to a cell active region of the semiconductor substrate. The peripheral gate pattern may be disposed on a peripheral active region of the semiconductor substrate. A cell contact plug may be formed between the cell bit line pattern and the cell active region. A peripheral contact plug may be formed on the peripheral active region on a side of the peripheral gate pattern. An insulating layer may be formed to expose top surfaces of the cell bit line pattern, the peripheral gate pattern, and the cell and peripheral contact plugs at substantially the same level.

16 Claims, 11 Drawing Sheets

U.S. PATENT DOCUMENTS

| | | | |
|---|---|---|---|
| 2008/0048333 A1* | 2/2008 | Seo et al. | 257/773 |
| 2008/0111155 A1* | 5/2008 | Capasso et al. | 257/192 |
| 2008/0265332 A1 | 10/2008 | Moriwaki | |

FOREIGN PATENT DOCUMENTS

| | | |
|---|---|---|
| JP | 10-242422 A | 9/1998 |
| JP | 2001-068643 A | 3/2001 |
| JP | 2004-534403 A | 11/2004 |
| KR | 10-2001-0005233 A | 1/2001 |
| KR | 10-2001-0088445 A | 9/2001 |
| KR | 10 2004-0012972 A | 2/2004 |
| KR | 10-2006-0038609 A | 5/2006 |
| KR | 10-2006-0131516 A | 12/2006 |
| KR | 10-2007-0001588 A | 1/2007 |
| KR | 10 2009-0029637 A | 3/2009 |

* cited by examiner

US 8,120,123 B2

SEMICONDUCTOR DEVICE AND METHOD OF FORMING THE SAME

CROSS-REFERENCE TO RELATED APPLICATIONS

This is a continuation-in-part application of U.S. patent application Ser. No. 12/232,498, filed Sep. 18, 2008, which is hereby incorporated by reference for all purposes

BACKGROUND

1. Field

Example embodiments relate to a semiconductor device and a method of forming the same.

2. Description of Related Art

In general, high integration of semiconductor devices may be embodied by simply reducing numerical values of design rules related to distances between components in a cell array region and a peripheral circuit region. Also, high-speed of the semiconductor devices may be embodied by rapidly charging components corresponding to reduced design rules with charges or allowing charges to rapidly pass between the components. As a result, the semiconductor devices may contribute toward configuring multifunctional electronic circuits in electronic products through the high integration and high-speed thereof.

However, the semiconductor devices may be fabricated under poor semiconductor fabrication process conditions. This is because the semiconductor devices may be structured to increase an aspect ratio of a contact structure out of consideration for the shapes of components, for example, the thicknesses, areas, and volumes of the components. In addition, the semiconductor devices may be structured to increase an electrical short-circuit and a parasitic capacitance between components due to the shrinkage of design rules.

SUMMARY

Embodiments are therefore directed to a semiconductor device and a method of forming the same, which substantially overcome one or more of the problems due to the limitations and disadvantages of the related art.

Embodiments provide a semiconductor device and a method of forming the same that realize favorable semiconductor fabrication process conditions.

Embodiments provide a semiconductor device and a method of forming the same that reduce an electrical short-circuit and a parasitic capacitance between components even in reduced design rules.

Embodiments provide a semiconductor device and a method of forming the same including a cell bit line pattern and a peripheral gate pattern formed of the same material in a cell array region and a peripheral circuit region, respectively.

Embodiments may be realized by providing a semiconductor device that includes an inactive region configured to define first and second active regions in a semiconductor substrate. A first upper interconnection is disposed on the inactive region adjacent to the first active region. A first contact plug contacts the first active region and the first upper interconnection. The first contact plug has a top surface at the same level as a top surface of the first upper interconnection. A second lower interconnection is disposed on the second active region. The second lower interconnection has a top surface at the same level as the top surface of the first contact plug. A second upper interconnection is disposed on the second lower interconnection. A second contact plug contacts the second upper interconnection and the second active region.

According to selected example embodiments, the first and second upper interconnections may have different structures and include bit lines.

According to selected example embodiments, the semiconductor device may further include a first lower interconnection intersecting the second upper interconnection. The first lower interconnection may protrude upward from a top surface of the semiconductor substrate. The first lower interconnection may extend downward from the top surface of the semiconductor substrate.

According to selected example embodiments, the first and second lower interconnections may have different structures and include gates. The first lower interconnection may have a stepped top surface or a substantially planar top surface across the first active region and the inactive region. The second lower interconnection may be formed of the same material as the first upper interconnection.

According to selected example embodiments, the first lower and upper interconnections may electrically interact with each other through the first active region and the first contact plug. Also, the second lower and upper interconnections may electrically interact with each other through the second active region and the second contact plug.

According to selected example embodiments, the first and second contact plugs may have the same structure or different structures. Also, the second contact plug may have a top surface at the same level as or a different level from the top surface of the second lower interconnection.

According to selected example embodiments, a first end of the first contact plug may be inserted into an upper portion of the first upper interconnection, and a second end of the first contact plug may contact the first active region and the inactive region disposed adjacent to the first active region.

According to selected example embodiments, the semiconductor device may further include first and second gate spacers sequentially stacked on each of both sidewalls of the second lower interconnection.

According to the remaining example embodiments, the first upper interconnection may be disposed parallel to the first active region and at a right angle to the first lower interconnection.

According to the remaining example embodiments, the first upper interconnection may be disposed parallel to the first active region and oblique to the first lower interconnection.

Embodiments may be realized by providing a semiconductor device that includes inactive regions disposed in a cell array region and a peripheral circuit region of a semiconductor substrate. Cell and peripheral active regions are defined by the inactive regions in the cell array region and the peripheral circuit region. A first interconnection, a second interconnection, and a cell contact plug are disposed in the cell array region. The first interconnection is disposed on the cell active region and the inactive region disposed adjacent to the cell active region. The second interconnection is disposed on the inactive region adjacent to the cell active region and intersects the first interconnection. The cell contact plug has a top surface at substantially the same level as a top surface of the second interconnection and contacts the cell active region and the second interconnection. A third interconnection, a fourth interconnection, and a peripheral contact plug are disposed in the peripheral circuit region. The third interconnection is disposed on the peripheral active region and formed of the same material as the second interconnection. The third interconnection has a top surface at the same level as the top surface of the cell contact plug. The fourth interconnection is disposed on the third interconnection. The peripheral contact plug contacts the peripheral active region and the fourth interconnection. The first interconnection is partially inserted into the second interconnection across the second interconnection. Alternatively, the first interconnection contacts the second interconnection under the second interconnection across the second interconnection.

According to selected example embodiments, the first and third interconnections may be disposed at different levels on the semiconductor substrate and have gates with different structures. The second and fourth interconnections may be disposed at different levels on the semiconductor substrate and have bit lines with different structures. Also, the second and third interconnections may be formed of the same material.

According to selected example embodiments, the cell and peripheral contact plugs may have the same structure or different structures. Also, the peripheral contact plug may have a top surface at the same level as or a different level from the top surface of the third interconnection.

According to the remaining example embodiments, the second interconnection may be disposed parallel to the cell active region and at a right angle to the first interconnection.

According to the remaining example embodiments, the second interconnection may include two lines defining an inflection point. The cell active region may be disposed parallel to the respective two lines of the second interconnection. The first interconnection may be disposed oblique to the cell active region and the second interconnection.

According to the remaining example embodiments, the second interconnection may include two lines defining an inflection point. The cell active region may have a center corresponding to the inflection point between the two lines of the second interconnection and be disposed parallel to the two lines of the second interconnection. The first interconnection may be disposed oblique to the cell active region and the second interconnection.

Embodiments may be realized by providing a method of forming a semiconductor device that includes forming first and second active regions in a semiconductor substrate, the first and second active regions defined by an inactive region. A first upper interconnection is formed on the inactive region adjacent to the first active region. A second lower interconnection is formed on the second active region. A first contact plug is formed to electrically connect the first active region and the first upper interconnection. A second contact plug is formed on the second active region adjacent to the second lower interconnection. A second upper interconnection is formed on the second contact plug.

According to selected example embodiments, the method may further include forming a first insulating layer on the first active region and the inactive region disposed adjacent to the first active region and forming a second insulating layer on the second active region. A first conductive layer and a third insulating layer may be sequentially formed on the first and second insulating layers. A first photoresist layer may be formed on the third insulating layer. The first photoresist layer may have an opening aligned with the first active region. The first and third insulating layers, the first conductive layer, the first active region, and the inactive region disposed adjacent to the first active region may be etched using the first photoresist layer as an etch mask to form a trench. The first photoresist layer may be removed from the semiconductor substrate.

According to selected example embodiments, the method may further include forming a second conductive layer to partially fill the trench. A fourth insulating layer may be formed on the second conductive layer to cover the third insulating layer. The third and fourth insulating layers may be etched until the first conductive layer is exposed, thereby forming a first lower interconnection in the trench. The first lower interconnection may include the second conductive layer and the etched fourth insulating layer. The first lower interconnection may be partially inserted into the first conductive layer or disposed under the first conductive layer.

According to selected example embodiments, the formation of the first upper and second lower interconnections may include sequentially forming a third conductive layer and a fifth insulating layer on the first conductive layer. First photoresist patterns may be formed on the fifth insulating layer. The first photoresist patterns may be formed to correspond to the first upper interconnection and the second lower interconnection. The first and third conductive layers and the fourth and fifth insulating layers may be etched using the first photoresist patterns as an etch mask until the first and second insulating layers are exposed. The first photoresist patterns may be removed from the semiconductor substrate. The third conductive layer may include at least one conductive material.

According to selected example embodiments, after forming the first upper interconnection and the second lower interconnection, the first upper interconnection may be disposed parallel to the first active region and disposed at a right angle to or oblique to the first lower interconnection.

According to selected example embodiments, the method may further include forming a sixth insulating layer on the first and second insulating layers to conformably cover the first upper interconnection and the second lower interconnection. The second and sixth insulating layers may be etched until the first insulating layer and the second active region are exposed, thereby forming first spacers on sidewalls of the first upper interconnection and the second lower interconnection. Second spacers may be formed on the first spacers formed on the sidewalls of the second lower interconnection. Seventh and eighth insulating layers may be sequentially formed on the first insulating layer, the second active region, and the inactive region to cover the first upper interconnection, the second lower interconnection, and the second spacers. The seventh and eighth insulating layers may be etched until the first upper interconnection and the second lower interconnection are exposed. In this case, the second spacers may include insulating material.

According to the remaining example embodiments, the formation of the first and second contact plugs may include forming a second photoresist layer on the seventh and eighth insulating layers. The second photoresist layer may have openings aligned with the first and second active regions to expose the eighth insulating layer. The first, seventh, and eighth insulating layers may be etched using the second photoresist layer as an etch mask to form first and second contact holes, the first and second contact holes exposing the first and second active regions, respectively. The second photoresist layer may be removed from the semiconductor substrate. The first and second contact holes may be filled with the first and second contact plugs. The first and second contact plugs may be formed of the same material.

According to the remaining example embodiments, the formation of the second upper interconnection may include sequentially forming a fourth conductive layer and a ninth insulating layer on the seventh and eighth insulating layers to cover the first and second contact plugs. A second photoresist pattern is formed on the ninth insulating layer. The second photoresist pattern may be formed to correspond to the second upper interconnection. The fourth conductive layer and the ninth insulating layer may be etched using the second photoresist pattern as an etch mask until the seventh and eighth insulating layers are exposed. The second photoresist pattern may be removed from the semiconductor substrate.

According to the remaining example embodiments, the formation of the first and second contact plugs may include forming a second photoresist layer on the seventh and eighth insulating layers. The second photoresist layer may have an opening aligned with the first active region to expose the eighth insulating layer. The first, seventh, and eighth insulating layers may be etched using the second photoresist layer as an etch mask, thereby forming a first contact hole exposing the first active region. The second photoresist layer may be removed from the semiconductor substrate. The first contact hole may be filled with the first contact plug. A ninth insulating layer may be formed on the seventh and eighth insulating layers to cover the first contact plug. A third photoresist layer may be formed on the ninth insulating layer. The third photoresist layer may have an opening aligned with the second active region to expose the ninth insulating layer. The seventh, eighth, and ninth insulating layers may be etched using the third photoresist layer as an etch mask, thereby forming a second contact hole exposing the second active region. The third photoresist layer may be removed from the semiconductor substrate. The second contact hole may be filled with the second contact plug. The first and second contact plugs may include at least one conductive material and have different structures.

According to the remaining example embodiments, the formation of the second upper interconnection may include sequentially forming a fourth conductive layer and a tenth insulating layer on the ninth insulating layer to cover the second contact plug. A second photoresist pattern may be formed on the tenth insulating layer. The second photoresist pattern may be formed to correspond to the second upper interconnection. The fourth conductive layer and the tenth insulating layer may be etched using the second photoresist pattern as an etch mask until the ninth insulating layer is exposed. The second photoresist pattern may be removed from the semiconductor substrate.

BRIEF DESCRIPTION OF THE DRAWINGS

The above will become more apparent to those of ordinary skill in the art by describing in detail exemplary embodiments with reference to the attached drawings, in which.

DETAILED DESCRIPTION

Korean Patent Application No. 10-2009-0029012, filed on Apr. 3, 2009, in the Korean Intellectual Property Office, and entitled: "Semiconductor Device and Method of Forming the Same," is incorporated by reference herein in its entirety.

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section.

The terms "pad," "base," and "mask" may be used herein to describe the purposes of semiconductor layers formed before semiconductor patterns are formed. Spatially relative terms, such as "cell," "lower (side)," "upper (side)," "under," "adjacent to," "central," "on" and the like, may be used herein for ease of description to describe one element or feature's relationship to another element(s) or feature(s) as illustrated in the figures. The terminology used herein is for the purpose of describing particular embodiments only and is not intended to be limiting of the inventive concept.

Hereinafter, a semiconductor device according to example embodiments will be described in further detail with reference to FIGS. 1 through 4.

Figure 1:
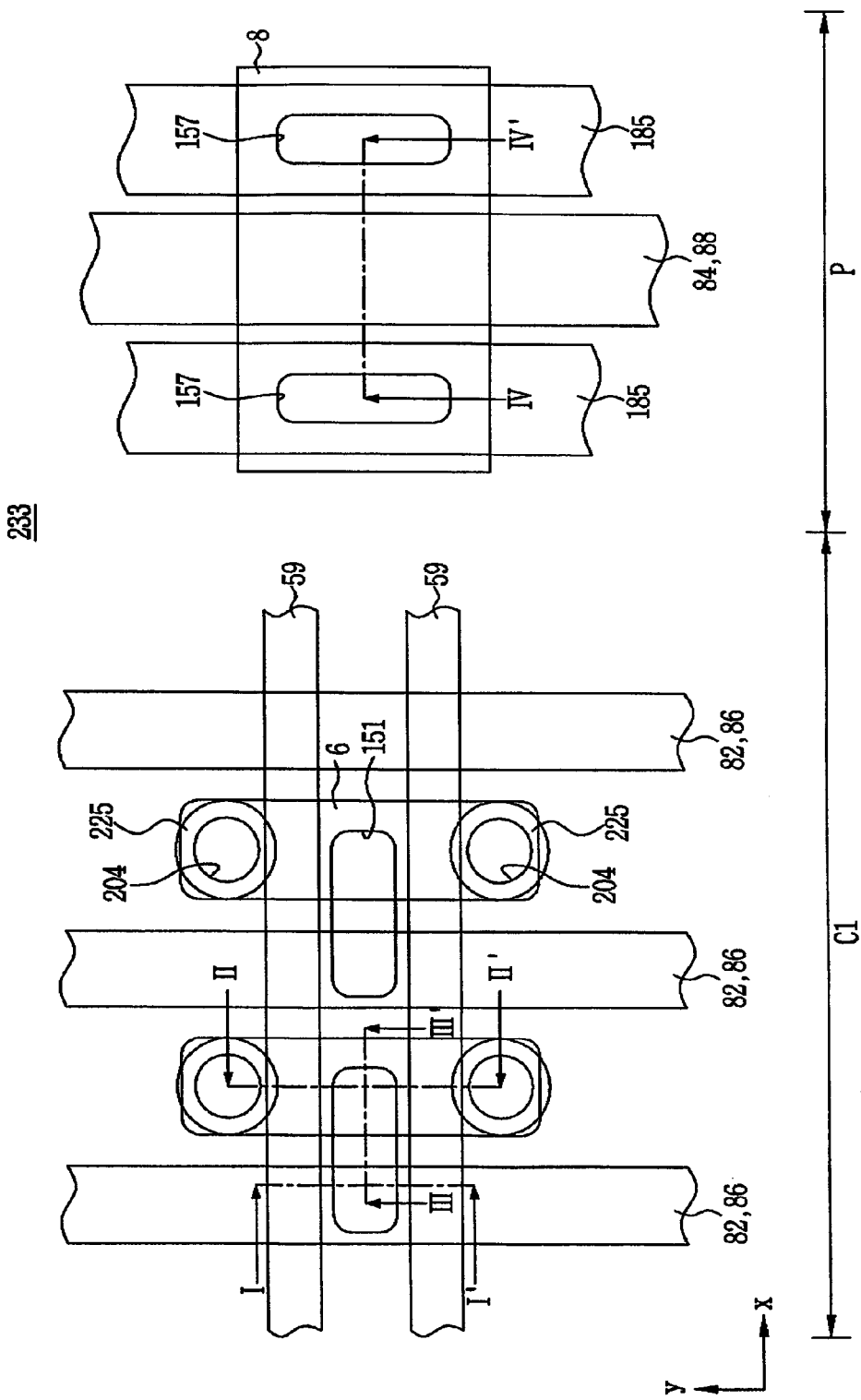
FIGS. 1 through 3 illustrate plan views of semiconductor devices according to example embodiments.
Figure 2:
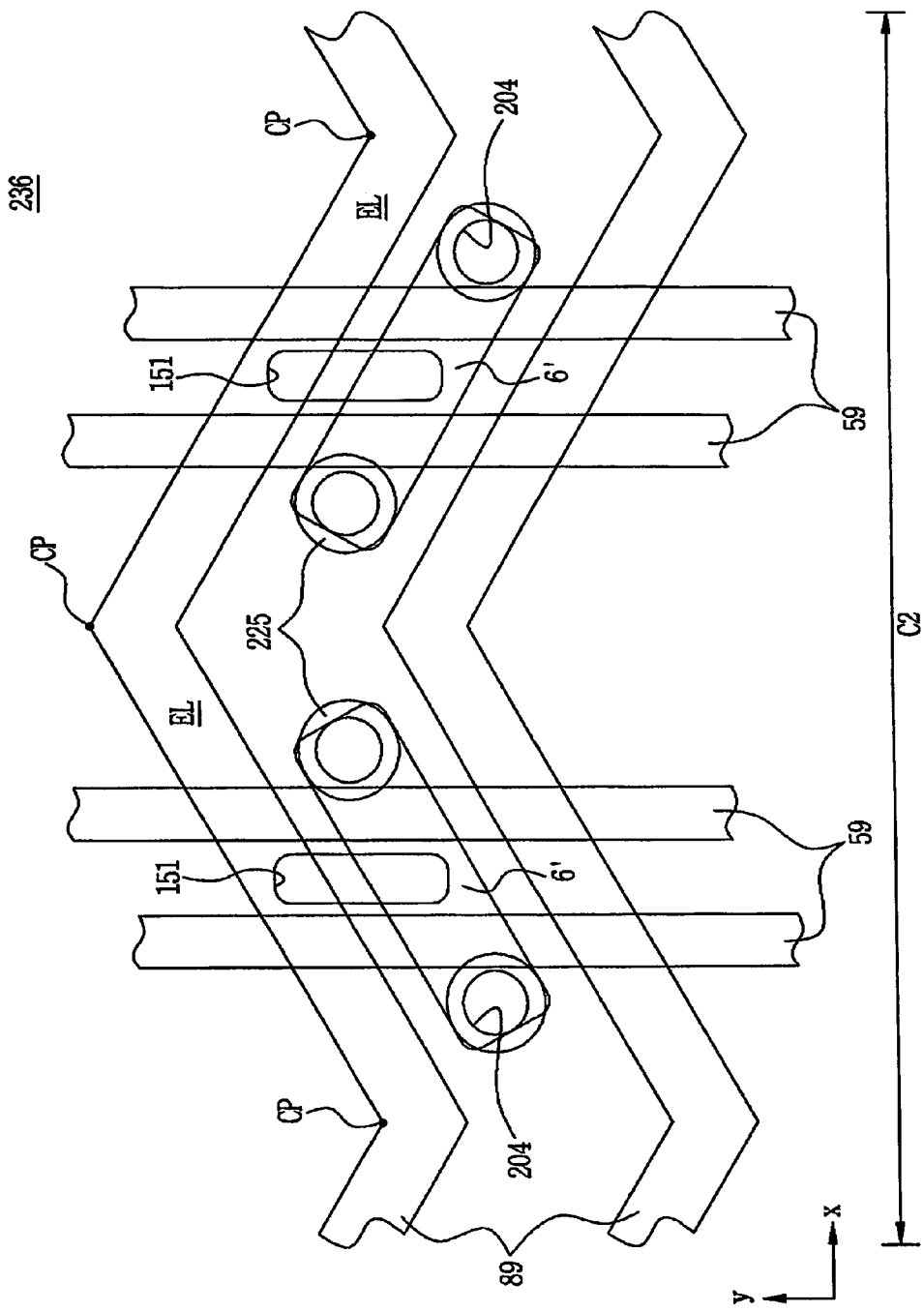
Figure 3:
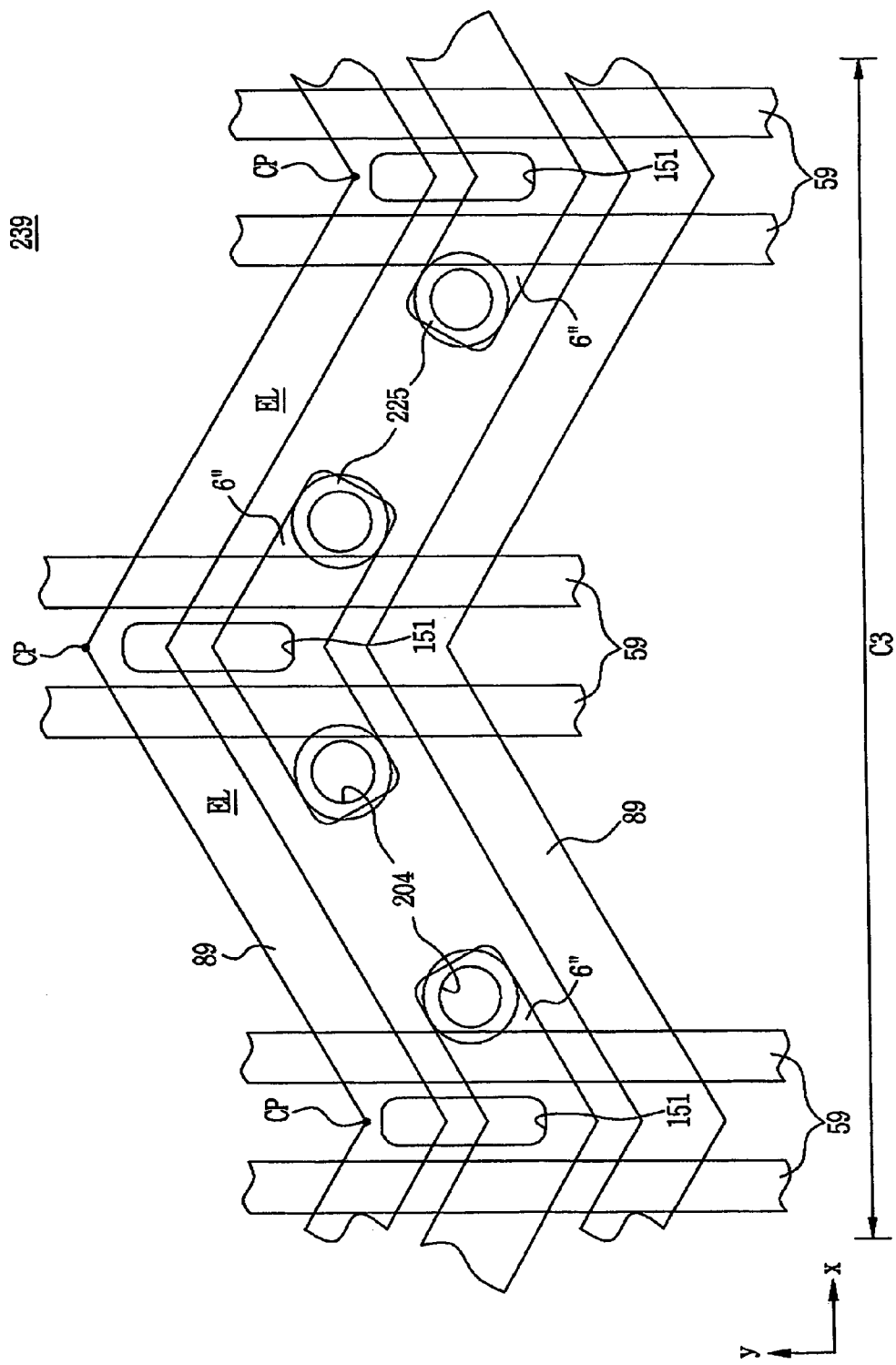
Figure 4:
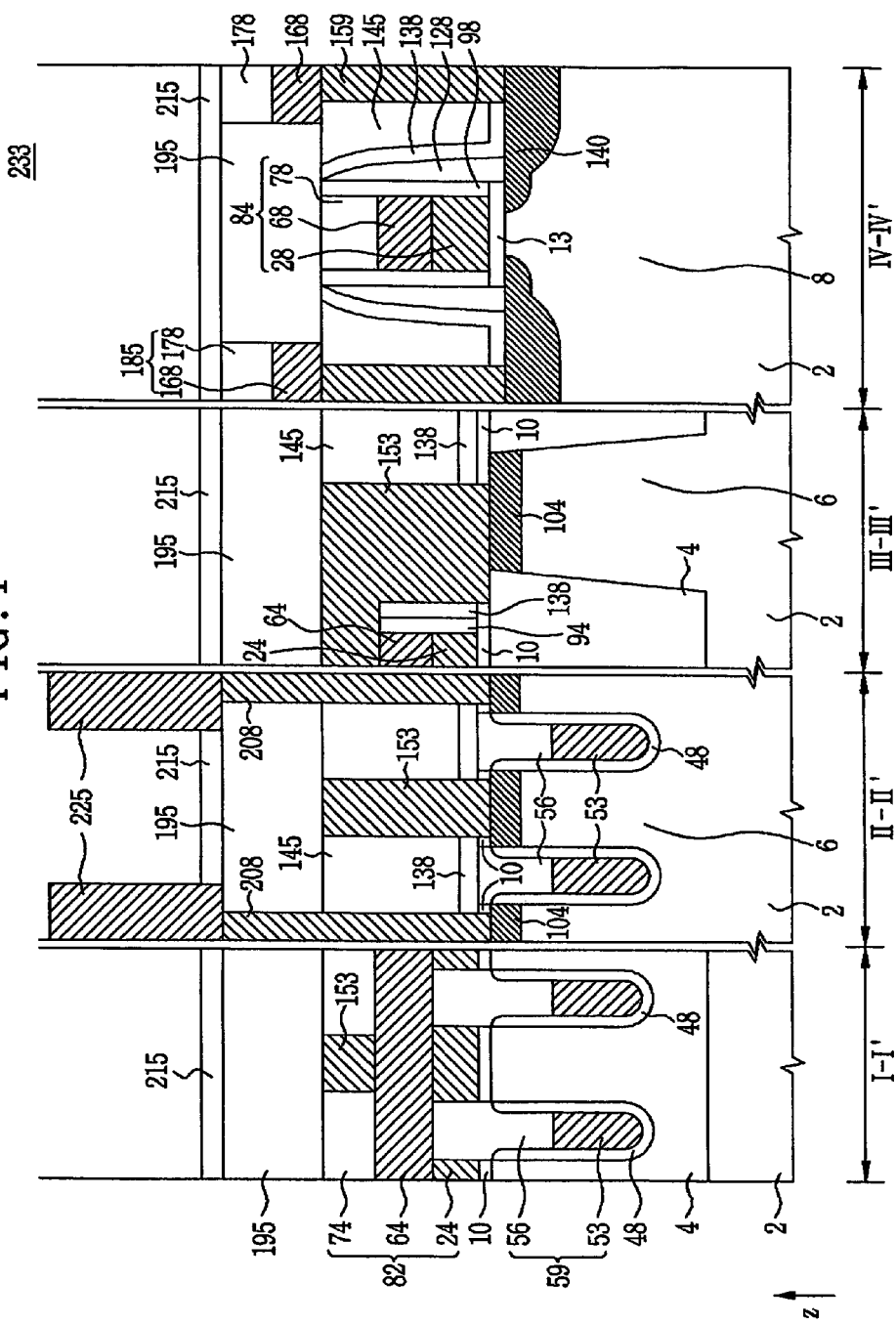
FIG. 4 illustrates a cross-sectional view showing cross-sections taken along lines I-I', II-II', III-III', and IV-IV' of FIG. 1.

FIGS. 1 through 3 illustrate plan views in the x-y plane of semiconductor devices according to example embodiments. FIG. 4 is a cross-sectional view showing cross-sections taken along lines I-I', and IV-IV' of FIG. 1, all along the z-axis. In FIGS. 1 through 4, the same reference numerals are used to denote the same elements.

Referring to FIG. 1, a semiconductor device 233 according to example embodiments may include a cell array region C1 and a peripheral circuit region P. The cell array region C1 may include cell gate patterns 59 and cell bit line patterns 82 or 86, which intersect each other. Cell active regions 6 may be disposed at right angles to the cell gate patterns 59. The cell active regions 6 may be interposed between the cell bit line patterns 82 or 86 parallel to the cell bit line patterns 82 or 86.

Cell contact holes 151 may partially overlap the cell active regions 6 and the cell bit line patterns 82 or 86. The cell contact holes 151 may be disposed in central regions of the cell active regions 6. The cell contact holes 151 may be disposed between the cell gate patterns 59. Node contact holes 204 and storage nodes 225 may be disposed in edges of the cell active regions 6 adjacent to the cell contact holes 151.

Meanwhile, the peripheral circuit region P may include a peripheral gate pattern 84 or 88 and peripheral bit line patterns 185, which are parallel to each other. Peripheral active regions 8 may be disposed across the peripheral gate pattern 84 or 88 and the peripheral bit line patterns 185. Peripheral contact holes 157 may be disposed in the peripheral active region 8 and overlap the peripheral bit line patterns 185.

Referring to FIG. 2, a semiconductor device 236 according to example embodiments may include a cell array region C2 and the peripheral circuit region P. The cell array region C2 may include cell active regions 6' and cell bit line patterns 89. The cell active regions 6' may be disposed between the cell bit line patterns 89. The cell bit line patterns 89 may have elemental lines EL defining inflection points (CP), i.e., local minima and maxima. In this case, the cell active regions 6' may be disposed between the inflection points CP and parallel to the elemental lines EL.

Cell gate patterns 59 may intersect the cell active regions 6' and the cell bit line patterns 89 obliquely. Cell contact holes 151 may overlap the cell active regions 6' and the cell bit line patterns 89. Node contact holes 204 and storage nodes 225 may be disposed in edges of the cell active regions 6'. In this case, the cell contact holes 151, the node contact holes 204, and the storage nodes 225 may be arranged in the same manner as shown in FIG. 1 with respect to the cell active regions 6', the cell gate patterns 59, and the cell bit line patterns 89.

Referring to FIG. 3, a semiconductor device 239 according to example embodiments may include a cell array region C3 and the peripheral circuit region P of FIG. 1. The cell array region C3 may include cell active regions 6" and cell bit line patterns 89. The cell active regions 6" may be disposed between the cell bit line patterns 89. The cell bit line patterns 89 may have the same shape as shown in FIG. 2. In this case, the cell active regions 6" may have central regions disposed under inflection points CP between elemental lines EL of the cell bit line patterns 89. Also, the cell active regions 6" may be disposed parallel to the elemental lines EL.

Cell gate patterns 59 may intersect the cell active regions 6" and the cell bit line patterns 89 obliquely. Inflection points CP of the cell bit line patterns 89 may be disposed between the cell gate patterns 59. Cell contact holes 151 may overlap the cell active regions 6" and the cell bit line patterns 89. The cell contact holes 151 may be formed on the inflection points CP of the cell bit line patterns 89. Node contact holes 204 and storage nodes 225 may be disposed in edges of the cell active regions 6.

The cell contact holes 151, the node contact holes 204, and the storage nodes 225 may be arranged in the same manner as shown in FIG. 1 with respect to the cell active regions 6, the cell gate patterns 59, and the cell bit line patterns 89.

Referring to FIG. 4, a semiconductor substrate 2 according to example embodiments may be prepared. The semiconductor substrate 2 may have the cell array region C1 and peripheral circuit region P, as shown in FIG. 1. A cell bit line pattern 82 and a peripheral gate pattern 84 may be disposed in the cell array region C1 and the peripheral circuit region P, respectively. As shown in the cross-section taken along line I-I', the cell bit line pattern 82 may be disposed on an inactive region 4 adjacent to a cell active region 6 in the cell array region C1. The cell bit line pattern 82 may include a cell lower bit line 24, a cell upper bit line 64, and a cell bit line capping pattern 74, which are stacked sequentially.

The cell lower bit line 24 and the cell upper bit line 64 may include conductive material. The cell bit line capping pattern 74 may include insulating material. As shown in the cross-section taken along line IV-IV', the peripheral gate pattern 84 may be disposed on a peripheral active region 8 in the peripheral circuit region P. The peripheral gate pattern 84 may include a peripheral lower gate 28, a peripheral upper gate 68, and a peripheral gate capping pattern 78, which are stacked sequentially. The peripheral lower gate 28, the peripheral upper gate 68, and the peripheral gate capping pattern 78 may be formed of the same materials as the cell lower bit line 24, the cell upper bit line 64, and the cell bit line capping pattern 74, respectively.

A pad layer 10 may be disposed on the inactive region 4 and the cell active region 6. The pad layer 10 may include insulating material. A peripheral gate insulating pattern 13 may be disposed between the peripheral gate pattern 84 and the peripheral active region 8. The peripheral gate insulating pattern 13 may include insulating material. Bit line spacers 94 may be disposed on sidewalls of the cell bit line pattern 82. The bit line spacers 94 may include insulating material. Lower and upper gate spacers 98 and 128 may be sequentially formed on sidewalls of the peripheral gate pattern 84.

The lower and upper gate spacers 98 and 128 may include insulating material. An etch stop layer 138 and a lower interlayer insulating layer 145 may be sequentially disposed on the semiconductor substrate 2 to surround the cell bit line pattern 82 and the peripheral gate pattern 84. The etch stop layer 138 and the lower interlayer insulating layer 145 may be disposed on the peripheral active region 8, the pad layer 10, and the upper gate spacers 128. The etch stop layer 138 and the lower interlayer insulating layer 145 may include insulating material. Cell contact plugs 153 and peripheral contact plugs 159 may be disposed on the pad layer 10, the etch stop layer 138, and the lower interlayer insulating layer 145. The cell contact plugs 153 and the peripheral contact plugs 159 may penetrate the pad layer 10, the etch stop layer 138, and the lower interlayer insulating layer 145 and contact the cell active region 6 and the peripheral active region 8, respectively.

The cell contact plug 153 and the peripheral contact plugs 159 may include conductive material. As shown in the cross-section taken along line II-II', the cell contact plug 153 may be surrounded by the pad layer 10, the etch stop layer 138, and the lower interlayer insulating layer 145. As shown in the cross-sectional views taken along lines I-I' and III-III', the cell contact plug 153 may be in contact with the cell active region 6 and the cell bit line pattern 82. More specifically, the cell contact plug 153 may contact the cell active region 6 and extend along a lateral portion of the cell bit line pattern 82 and be inserted into the cell bit line capping pattern 74, as shown in the cross-sectional views taken along lines I-I' and III-III'. In this case, the cell contact plug 153 may be in contact with the cell upper bit line 64 through the cell bit line capping pattern 74.

The peripheral contact plugs 159 may be surrounded by the etch stop layer 138 and the lower interlayer insulating layer 145. As shown in the cross-section taken along line IV-IV', the peripheral contact plugs 159 may be disposed on both sides of the peripheral gate pattern 84 and contact the peripheral active region 8. The peripheral contact plugs 159 may have a top surface at substantially the same level, i.e., height along the z-axis, as top surfaces of the cell bit line pattern 82, the peripheral gate pattern 84, and the cell contact plug 153. Peripheral bit line patterns 185 may be disposed on the peripheral gate pattern 84. The peripheral bit line patterns 185 may be in contact with the peripheral contact plugs 159.

The peripheral bit line pattern 185 may include a peripheral bit line 168 and a peripheral bit line capping pattern 178, which are stacked sequentially. The peripheral bit line 168 may include conductive material. The bit line capping pattern 178 may include insulating material. An upper interlayer insulating layer 195 may be disposed on the etch stop layer 138 and the lower interlayer insulating layer 145 to surround the peripheral bit line pattern 185. The upper interlayer insulating layer 195 may include insulating material. The upper interlayer insulating layer 195 may expose top surfaces of the peripheral bit line patterns 185.

As illustrated along lines II-II', node plugs 208 may be disposed in the lower and upper interlayer insulating layers 145 and 195, the etch stop layer 138, and the pad layer 10. The node plugs 208 may include conductive material. The node plugs 208 may be in contact with the cell active region 6. The node plugs 208 may have top surfaces at the same level, i.e., along the z-axis, as the top surfaces of the peripheral bit line patterns 185. A protection layer 215 may be disposed on the upper interlayer insulating layer 195 to cover the peripheral bit line pattern 185 and the node plugs 208. The protection layer 215 may include insulating material. Storage nodes 225 may be disposed in the protection layer 215 and extend upward from the protection layer 215. The storage nodes 225 may include conductive material.

The storage nodes 225 may be in contact with the node plugs 208 through the protection layer 215. Meanwhile, cell gate patterns 59 may be disposed under the cell bit line pattern 82 and the peripheral gate pattern 84. The cell gate patterns 59 may be disposed in the inactive region 4 and the cell active region 6 of the cell array region C1. More specifically, the cell gate patterns 59 may protrude upward along the z-axis from a top surface of the semiconductor substrate 2. Also, the cell gate patterns 59 may extend downward along the z-axis from the top surface of the semiconductor substrate 2. In this case, the respective gate patterns 59 may have top surfaces with different levels as shown in the cross-sectional views taken along lines I-I' and II-II'.

The cell gate patterns 59 formed under the cell bit line pattern 82 and adjacent to the cell bit line pattern 82 may have a step difference. Also, the cell gate patterns 59 may run across the inactive region 4 and the cell active region 6 in a horizontal direction. As shown in the cross-section taken along lines II-II', the cell gate patterns 59 may be disposed under and between the cell contact plug 153 and the node plugs 208 in the cell active region 6. The cell gate patterns 59 may include cell gates 53 and cell gate capping patterns 56. The cell gates 53 may include conductive material. The cell gate capping patterns 56 may include insulating material.

As shown in the cross-section taken along line I-I', the cell gate capping patterns 56 of the cell gate patterns 59 may divide the cell lower bit line 24 of the cell bit line pattern 82 into plural regions. Cell gate insulating patterns 48 may be disposed between the cell active region 6 and the cell gate patterns 59. However, the cell gate insulating patterns 48 may have different thicknesses in the inactive region 4 and the cell active region 6 using a thermal oxidation process.

As illustrated along lines II-II' and III-III', cell impurity regions 104 may be disposed adjacent to the cell gate patterns 59. The cell impurity regions 104 may be in contact with the cell contact plug 153 and the node plugs 208. The cell gate patterns 59 and the cell impurity regions 104 may be included in cell transistors.

As illustrated along lines IV-IV', peripheral impurity regions 140 may be disposed under the peripheral gate pattern 84. The peripheral impurity regions 140 may overlap the peripheral gate pattern 84 and contact the peripheral contact plugs 159. The cell impurity regions 104 may have a different conductivity type from the peripheral impurity regions 140. The peripheral impurity regions 140 may have a lightly-doped drain (LDD) structure. The peripheral gate pattern 84 and the peripheral impurity regions 140 may be included in a peripheral transistor.

As a result, the cell transistors and the peripheral transistor may constitute the semiconductor device 233 of FIG. 1 along with the cell bit line pattern 82, the peripheral bit line patterns 185, and the storage nodes 225. Alternatively, the semiconductor device 233 may be replaced with the semiconductor device 236 of FIG. 2 or the semiconductor device 239 of FIG. 3.

Hereinafter, a method of forming a semiconductor device according to example embodiments will be described with reference to FIGS. 5 through 11.

FIGS. 5 through 8 illustrate cross-sectional views taken along lines I-I', II-II', III-III', and IV-IV' of FIG. 1, of stages in a method of forming a semiconductor device according to example embodiments. In FIGS. 5 through 8, the same reference numerals are used to denote the same elements as in FIGS. 1 through 4.

Figure 5:
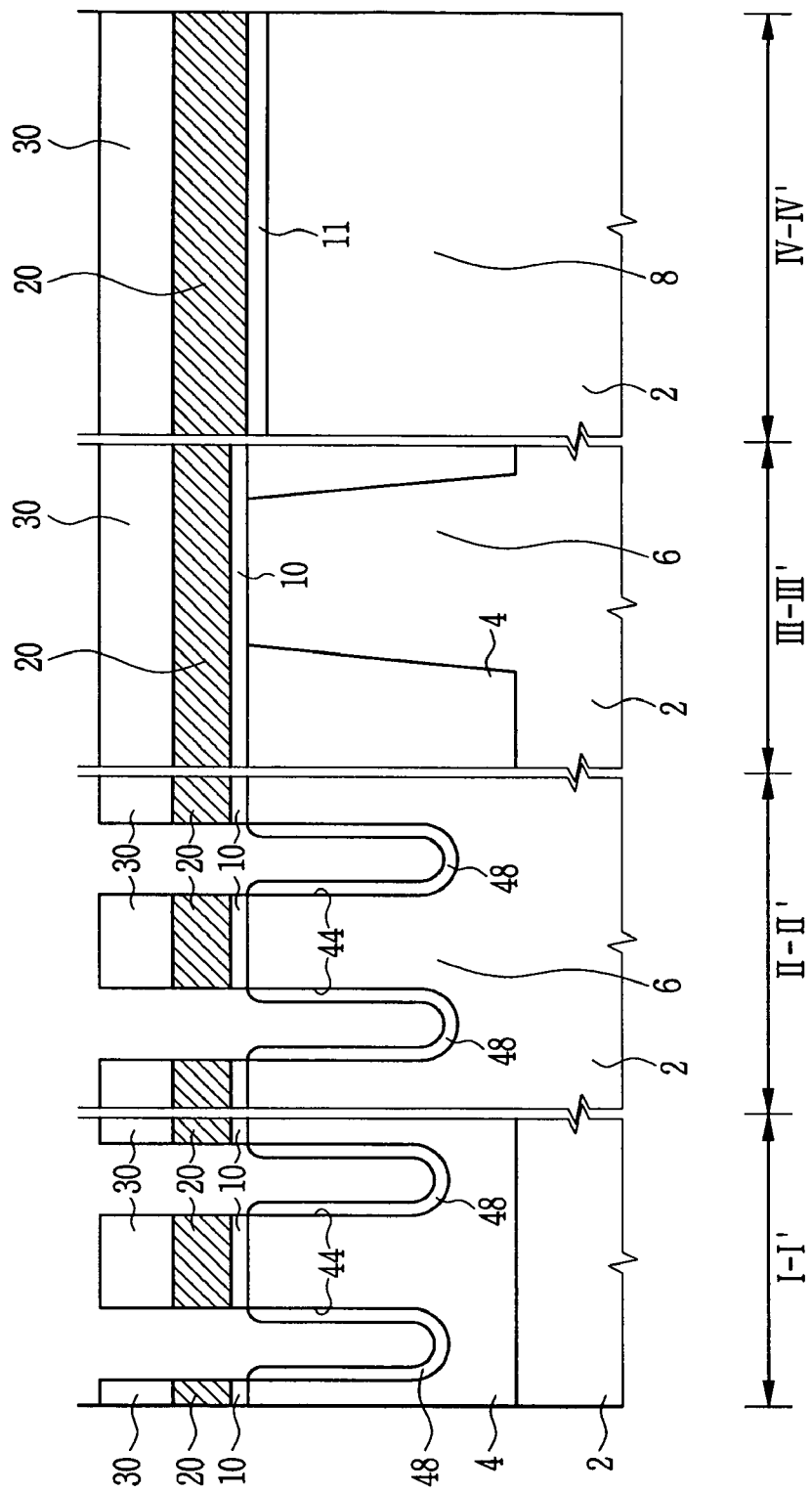
FIGS. 5 through 8 illustrate cross-sectional views showing cross-sections taken along lines I-I', II-II', III-III', and IV-IV' of FIG. 1, of stages in a method of forming a semiconductor device according to example embodiments.

Referring to FIG. 5, the semiconductor substrate 2 according to example embodiments may be prepared. The semiconductor substrate 2 may have the cell array region C1 and the peripheral circuit region P as shown in FIG. 1. The cell array region C1 may have at least one cell active region 6. The peripheral circuit region P may have at least one peripheral active region 8. The cell active region 6 and the peripheral active region 8 may be defined by the inactive region 4 in the semiconductor substrate 2. The inactive region 4 may have a device isolating layer. The device isolating layer may include insulating material.

A pad layer 10 may be formed on the cell active region 6 and the inactive region 5 disposed adjacent to the cell active region 6, while a peripheral gate insulating layer 11 may be formed on the peripheral active region 8. The pad layer 10 may include insulating material, for example, silicon nitride. The peripheral gate insulating layer 11 may include insulating material, for example, silicon oxide. The peripheral gate insulating layer 11 may be disposed also on the inactive region 4 defining the peripheral active region 8. However, when a thermal oxidation process is employed, the peripheral gate insulating layer 11 may be formed to different thicknesses in the inactive region 4 and the peripheral active region 8.

A mask conductive layer 20 and a mask capping layer 30 may be sequentially formed on the pad layer 10 and the peripheral gate insulating layer 11. The mask conductive layer 20 may include conductive material, for example, doped polysilicon (poly-Si). The mask capping layer 30 may include insulating material, for example, silicon nitride. A photoresist layer may be formed on the mask capping layer 30. The photoresist layer may have openings aligned with the cell active region 6 to expose the mask capping layer 30 in the cell array region C1.

The mask capping layer 30, the mask conductive layer 20, and the pad layer 10 may be sequentially etched using the photoresist layer as an etch mask, thereby forming trenches 44 in the cell active region 6 and the inactive region 4 disposed adjacent to the cell active region 6. The trenches 44 may extend from top surfaces of the cell active region 6 and the inactive region 4 disposed adjacent to the cell active region 6 toward a lower portion of the semiconductor substrate 2. After forming the trenches 44, the photoresist layer may be removed from the semiconductor substrate 2. As shown in the cross-sectional views taken along lines I-I' and II-II', cell gate insulating patterns 48 may be formed in the trenches 44.

The cell gate insulating patterns 48 may include insulating material, for example, silicon oxide. When a thermal oxidation process is employed, the cell gate insulating patterns 48 may be formed to different thicknesses in the inactive region 4 and the cell active region 6.

Figure 6:
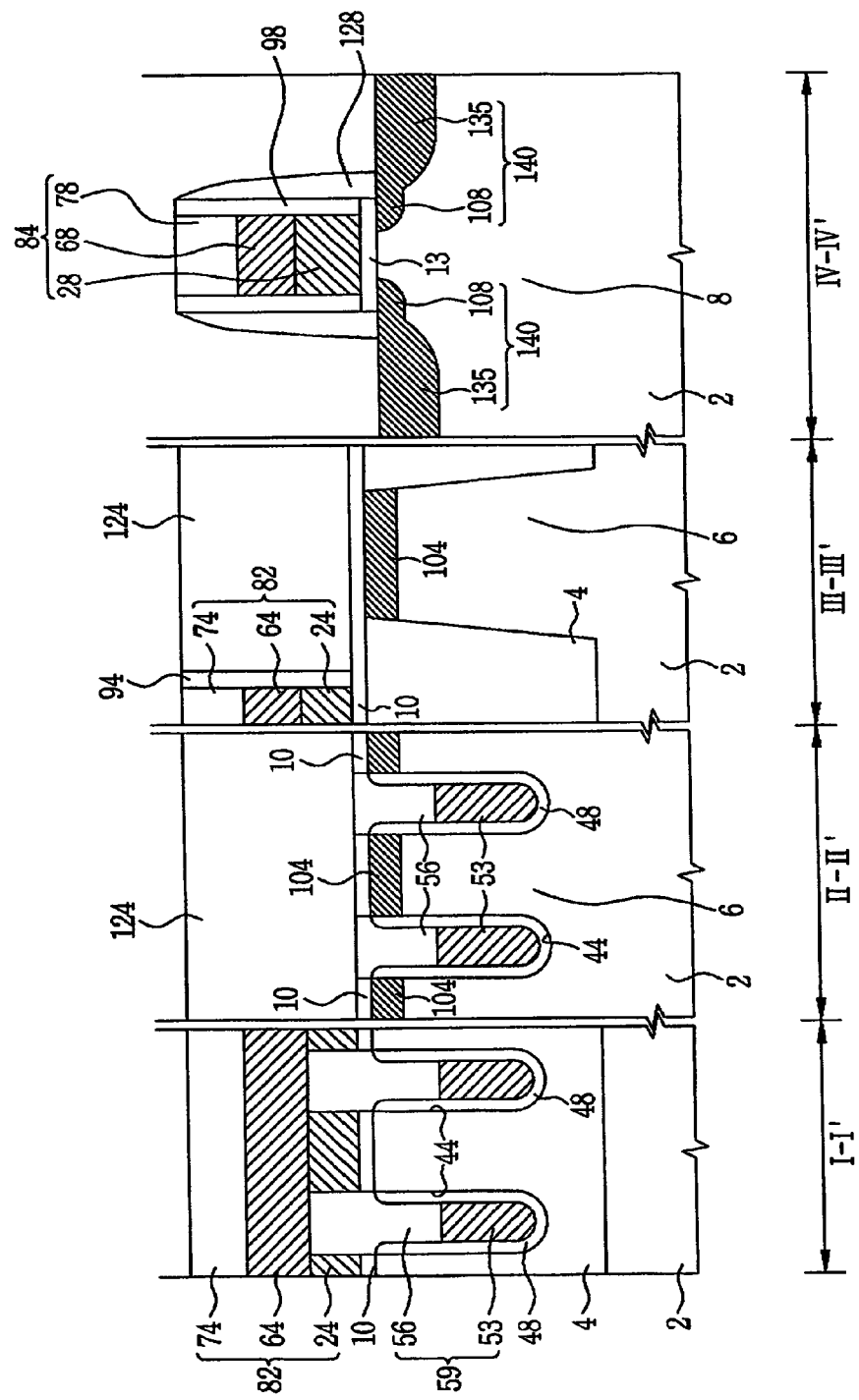

Referring to FIG. 6, cell gates 53 may be formed to partially fill the trenches 44. The cell gates 53 may include conductive material, for example, titanium nitride. A cell gate capping layer may be formed on the cell gates 53 to cover the mask capping layer 30. The cell gate capping layer may include insulating material, for example, silicon nitride. The cell gate capping layer and the mask capping layer 30 may be sequentially etched to expose the mask conductive layer 20 of FIG. 5, thereby forming cell gate capping patterns 56 as shown in the cross-section taken along line I-I' of FIG. 6.

Referring to the cross-section taken along line II-II', the cell gate capping patterns 56 may have the same shape as shown in the cross-section taken along line I-I'. In this case, the cell gate capping patterns 56 may be formed in the cell active region 6 to fill the trenches 44. Also, the cell gate capping patterns 56 may be formed in the pad layer 10 and the mask conductive layer 20. The cell gate capping patterns 56 may constitute cell gate patterns 59 along with the cell gates 53. A base conductive layer (not shown) and a base capping layer (not shown) may be sequentially formed on the mask conductive layer 20.

The base conductive layer may include conductive material. For example, the base conductive layer may include a barrier metal layer and a tungsten layer which are stacked sequentially. The barrier metal layer may include metal and/or metal nitride that prevents diffusion of tungsten atoms into the mask conductive layer 20. The base capping layer may include insulating material, for example, silicon nitride. Photoresist patterns may be formed on the base capping layer. The photoresist patterns may be formed in the cell array region C1 and the peripheral circuit region P. The photoresist pattern of the cell array region C1 may be formed on the inactive region 4 adjacent to the cell active region 6.

The photoresist pattern of the peripheral circuit region P may be formed on the peripheral active region 8 and the inactive region 4 disposed adjacent to the peripheral active region 8. The base capping layer, the base conductive layer, and the mask conductive layer 20 may be sequentially etched using the photoresist patterns as an etch mask, thereby forming the cell bit line pattern 82 and the peripheral gate pattern 84 of FIG. 1. The cell bit line pattern 82 may be formed on the inactive region 4 adjacent to the cell active region 6. As shown in the cross-section taken along line II-II', the cell bit line pattern 82 may be formed to expose the pad layer 10.

During the etching of the mask conductive layer 20, the cell gate capping pattern 56 may be partially removed from the cell active region 6 exposed by the photoresist pattern. As shown in the cross-section taken along lines I-I' and II-II', the cell gate capping pattern 56 disposed under and adjacent to the cell bit line pattern 82 may have top surfaces disposed at different levels. Thus, the cell gate capping pattern 56 may have a step difference between the top surfaces thereof. The cell bit line pattern 82 may be replaced with the cell bit line pattern 89 of FIG. 2 or 3. The peripheral gate pattern 84 may be formed on the peripheral active region 8 of the peripheral circuit region P and on the inactive region 4 disposed adjacent to the peripheral active region 8.

The peripheral gate pattern 84 may be formed to expose the peripheral gate insulating layer 11 of FIG. 5. The cell bit line pattern 82 may include a cell lower bit line 24, a cell upper bit line 64, and a bit line capping pattern 74 which are stacked sequentially. The peripheral gate pattern 84 may include a peripheral lower gate 28, a peripheral upper gate 68, and a peripheral gate capping pattern 78 which are stacked sequentially. After forming the cell bit line pattern 82 and the peripheral gate pattern 84, the photoresist patterns may be removed from the semiconductor substrate 2.

A lower spacer layer may be formed on the pad layer 10 and the peripheral gate insulating layer 11 to cover the cell bit line pattern 82 and the peripheral gate pattern 84. The lower spacer layer may include insulating material, for example, silicon nitride. The lower spacer layer may be etched so that bit line spacers 94 may be formed on sidewalls of the cell bit line pattern 82 and lower gate spacers 98 may be formed on sidewalls of the peripheral gate pattern 84. The bit line spacers 94 may be formed to expose the pad layer 10.

The lower gate spacers 98 may be formed to expose the peripheral active region 8. Subsequently, cell impurity regions 104 may be formed in the cell active region 6, while first peripheral impurity regions 108 may be formed in the peripheral active region 8. The cell impurity regions 104 may be formed using impurity ions between the cell gate patterns 59. The first peripheral impurity regions 108 may be formed using impurity ions to overlap the peripheral gate pattern 84. The cell impurity regions 104 and the first peripheral impurity regions 108 may have the same conductivity type or different conductivity types.

The cell impurity regions 104 may have a different conductivity type from the semiconductor substrate 2. The first peripheral impurity regions 108 may have the same conductivity type as or a different conductivity type from the semiconductor substrate 2. The spacer layer 124 may be formed in the cell array region C1 and the peripheral circuit region P to cover the cell bit line pattern 82 and the peripheral gate pattern 84. The upper spacer layer 124 may be formed on the cell bit line patterns 82 to sufficiently fill spaces between the cell bit line patterns 82 in the cell array region C1 of FIG. 1.

Alternatively, the upper spacer layer 124 may conformably cover the peripheral gate pattern 84 and the lower gate spacers 98 in the peripheral circuit region P. The upper spacer layer 124 may be etched, thereby forming upper gate spacers 128 on the lower gate spacers 98. Second peripheral impurity regions 135 may be formed in the peripheral active region 8 using the peripheral gate pattern 84 and the lower and upper gate spacers 98 and 128 as masks. The second peripheral impurity regions 135 may be formed using impurity ions to overlap the lower gate spacers 98 and/or the upper gate spacers 128.

The first and second peripheral impurity regions 108 and 135 may constitute peripheral impurity regions 140. The peripheral impurity regions 140 may have LDD structures. A photoresist layer may be formed in the peripheral circuit region P to cover the peripheral gate pattern 84 and the lower and upper gate spacers 98 and 128. The photoresist layer may be formed to expose the cell array region C1. The upper spacer layer 124 may be removed from the semiconductor substrate 2 using the photoresist layer as an etch mask and using the cell bit line pattern 82, the bit line spacers 94, and the pad layer 10 as etch buffer layers. Thereafter, the photoresist layer may be removed from the semiconductor substrate 2.

Figure 7:
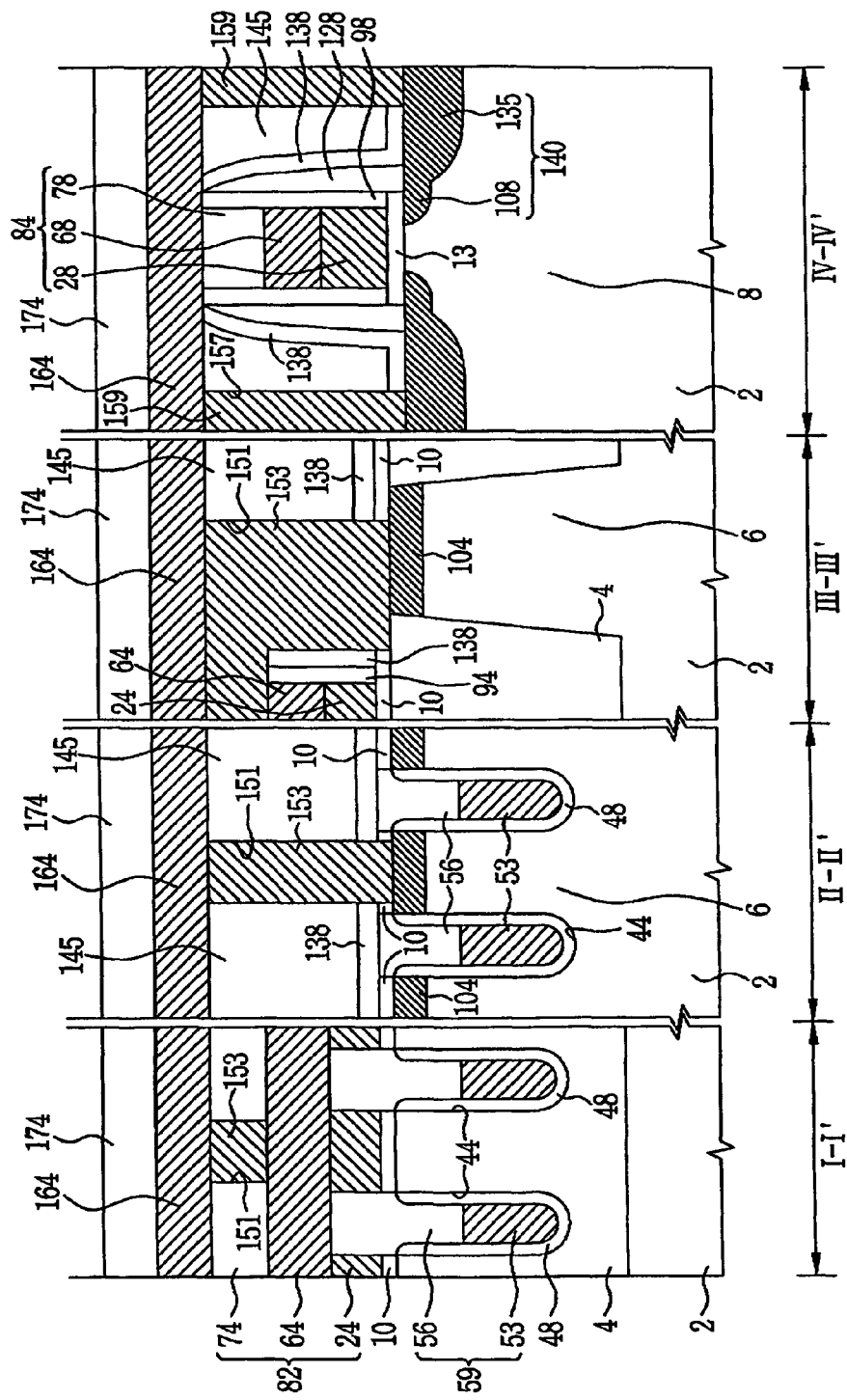

Referring to FIG. 7, according to example embodiments, the etch stop layer 138 and the lower interlayer insulating layer 145 may be sequentially formed in the cell array region C1 and the peripheral circuit region P to cover the cell bit line pattern 82 and the peripheral gate pattern 84. The etch stop layer 138 may include insulating material, for example, silicon nitride. The lower interlayer insulating layer 145 may include insulating material, for example, silicon oxide. The lower interlayer insulating layer 145 and the etch stop layer 138 may be sequentially etched to expose the cell bit line pattern 82 and the peripheral gate pattern 84.

A photoresist layer may be formed on the etch stop layer 138 and the lower interlayer insulating layer 145. The photoresist layer may have openings exposing the lower interlayer insulating layer 145. The openings may be formed between the cell gate patterns 59 in the cell array region C1 and also, formed on lateral portions of the peripheral gate pattern 84 in the peripheral circuit region P. The lower interlayer insulating layer 145, the etch stop layer 138, the cell bit line capping pattern 74, and the pad layer 10 may be sequentially etched using the photoresist layer as an etch mask, thereby forming the cell contact hole 151 and peripheral contact holes 157 as shown in FIG. 1.

As shown in the cross-section taken along lines I-I', II-II', and III-III', the cell contact hole 151 may be formed to expose the cell active region 6, the inactive region 4 disposed adjacent to the cell active region 6, and the cell bit line pattern 82.

In this case, the cell contact hole 151 may be formed to penetrate the cell bit line capping pattern 74 in an upper portion of the cell bit line pattern 82 and expose the cell upper bit line 64, the bit line spacer 94, and the etch stop layer 138. Also, the cell contact hole 151 may be formed to expose the etch stop layer 138 on a lateral side of the cell bit line pattern 82.

The peripheral contact holes 157 may be formed to expose the peripheral active region 8. After forming the cell and peripheral contact holes 151 and 157, the photoresist layer may be removed from the semiconductor substrate 2. A contact plug layer may be formed on the etch stop layer 138 and the lower interlayer insulating layer 145 to fill the cell and peripheral contact holes 151 and 157. The contact plug layer may include conductive material. For example, the contact plug layer may include a barrier metal layer and a tungsten layer which are stacked sequentially. The barrier metal layer may be formed of the same barrier metal as the base conductive layer of FIG. 6.

The contact plug layer may be etched to expose the etch stop layer 138 and the lower interlayer insulating layer 145 so that the cell contact plug 153 may be formed in the cell contact hole 151, and peripheral contact plugs 159 may be formed in the peripheral contact holes 157. As a result, the cell and peripheral contact plugs 153 and 159 may have top surfaces at substantially the same level as top surfaces of the cell bit line pattern 82 and the peripheral gate pattern 84. Subsequently, an interconnection layer 164 and an interconnection capping layer 174 may be formed on the etch stop layer 138 and the lower interlayer insulating layer 145 to cover the cell and peripheral contact plugs 153 and 159.

The interconnection layer 164 may be formed of the same material as the contact plug layer. The interconnection capping layer 174 may include insulating material, for example, silicon nitride.

Figure 8:
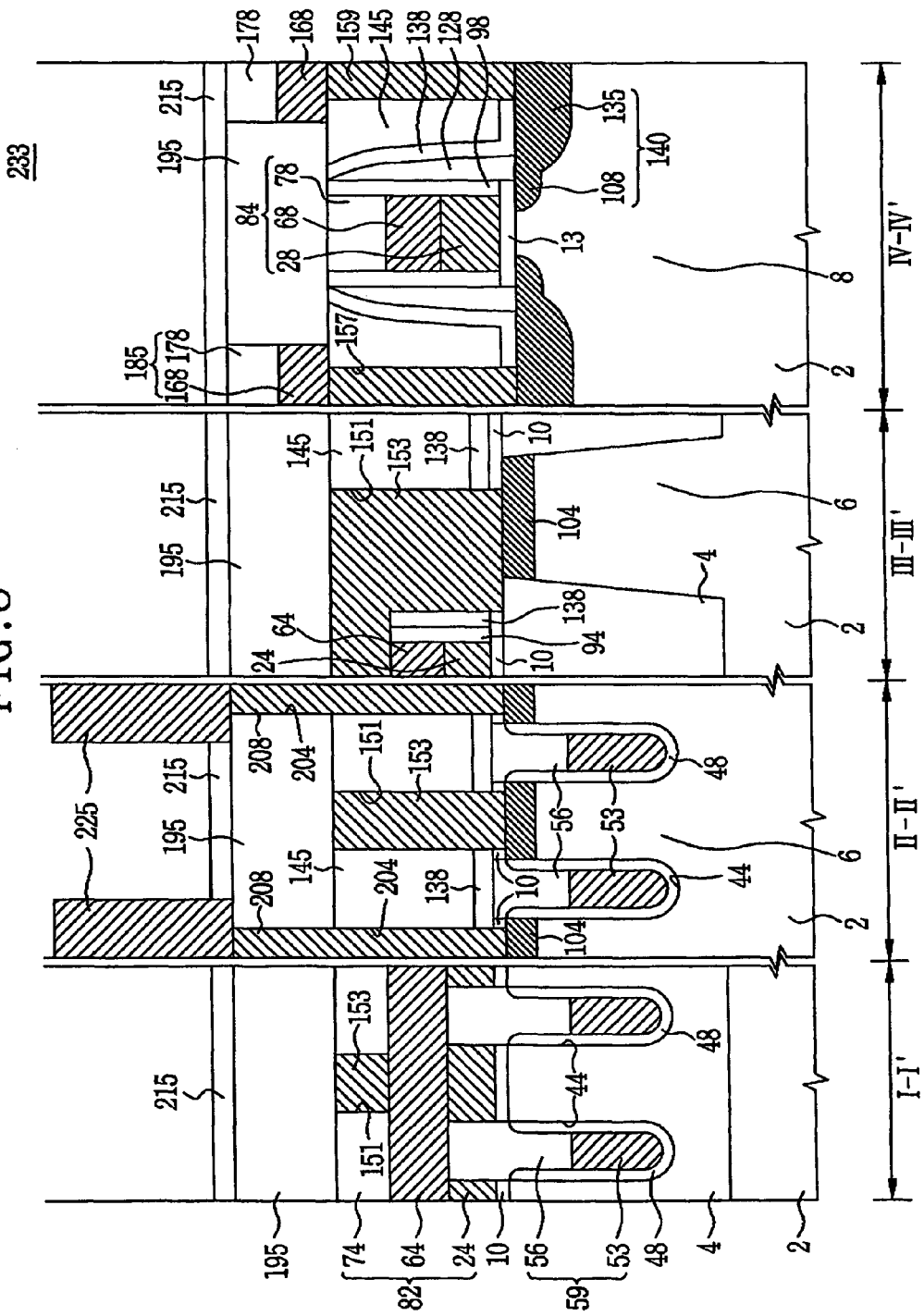

Referring to FIG. 8, according to example embodiments, photoresist patterns may be formed on the interconnection layer 174 of FIG. 7. The interconnection capping layer 174 and the interconnection layer 164 may be sequentially etched using the photoresist patterns as an etch mask, thereby forming peripheral bit line patterns 185 in the peripheral circuit region P. The peripheral bit line patterns 185 may be formed to expose the etch stop layer 138 and the lower interlayer insulating layer 145. The peripheral bit line patterns 185 may include the peripheral bit line 168 and the peripheral bit line capping pattern 178.

After forming the peripheral bit line patterns 185, the photoresist patterns may be removed from the semiconductor substrate 2. Thereafter, the upper interlayer insulating layer 195 may be formed on the etch stop layer 138 and the lower interlayer insulating layer 145 to expose the peripheral bit line patterns 185. The upper interlayer insulating layer 195 may include insulating material, for example, silicon oxide. A photoresist layer may be formed on the upper interlayer insulating layer 195. The photoresist layer may have openings aligned with the cell active region 6 in the cell array region C1.

The upper interlayer insulating layer 195, the lower interlayer insulating layer 145, the etch stop layer 138, and the pad layer 10 may be sequentially etched using the photoresist layer as an etch mask, thereby forming node contact holes 204. The node contact holes 204 may be formed to expose the cell active region 6. After forming the node contact holes 204, the photoresist layer may be removed from the semiconductor substrate 2. Node plugs 208 may be formed in the node contact holes 204. The node plugs 208 may include conductive material, for example, poly-Si.

The protection layer 215 may be formed on the upper interlayer insulating layer 195 to cover the peripheral bit line pattern 185 and the node plugs 208. The protection layer 215 may include insulating material, for example, silicon nitride. Storage nodes 225 may be formed through the protection layer 215 and brought into contact with the node plugs 208. The storage nodes 225 may include conductive material, for example, titanium nitride. As a result, the storage nodes 225 may constitute the semiconductor device 233 according to the example embodiments along with the cell gate pattern 59, the cell bit line pattern 82, the peripheral gate pattern 84, and the peripheral bit line patterns 185.

In addition, the semiconductor device 233 may be replaced with the semiconductor device 236 of FIG. 2 or the semiconductor device 239 of FIG. 3. As compared with the conventional art, the semiconductor device 233, 236, or 239 may have a lower parasitic capacitance between the cell bit line pattern 82 the cell contact plug 153, the node plugs 208, and the storage nodes 225. This is because the cell bit line pattern 82 and the cell contact plug 153 may have top surfaces disposed at the same level from the top surface of the semiconductor substrate 2. The semiconductor device 233, 236, or 239 may have a higher occupancy ratio of components on the semiconductor substrate 2 than in the conventional art. This is because the cell bit line pattern 82 may be formed on the inactive region 4.

As compared with the conventional art, the semiconductor device 233, 236, or 239 may reduce an electrical short-circuit between the cell bit line pattern 82, the cell contact plug 153, and the node plugs 208. This is because the cell bit line pattern 82 and the cell contact plug 153 may not be sequentially stacked on the semiconductor substrate 2, reducing the probability of an electrical short-circuit.

Figure 9:
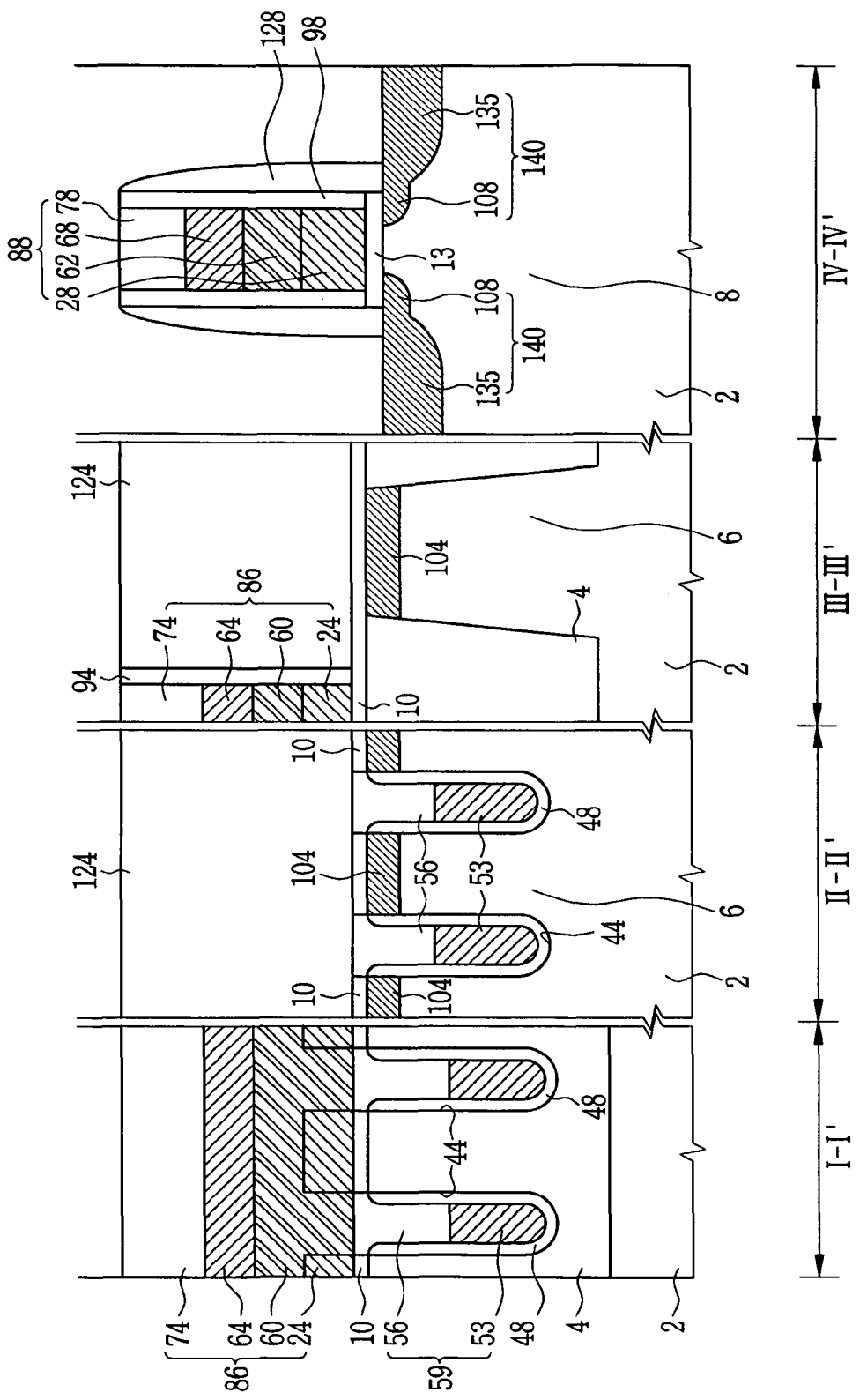
FIGS. 9 through 11 illustrate cross-sectional views showing cross-sections taken along lines I-I', II-II', III-III', and IV-IV' of FIG. 1, of stages in a method of forming a semiconductor device according to example embodiments.
Figure 10:
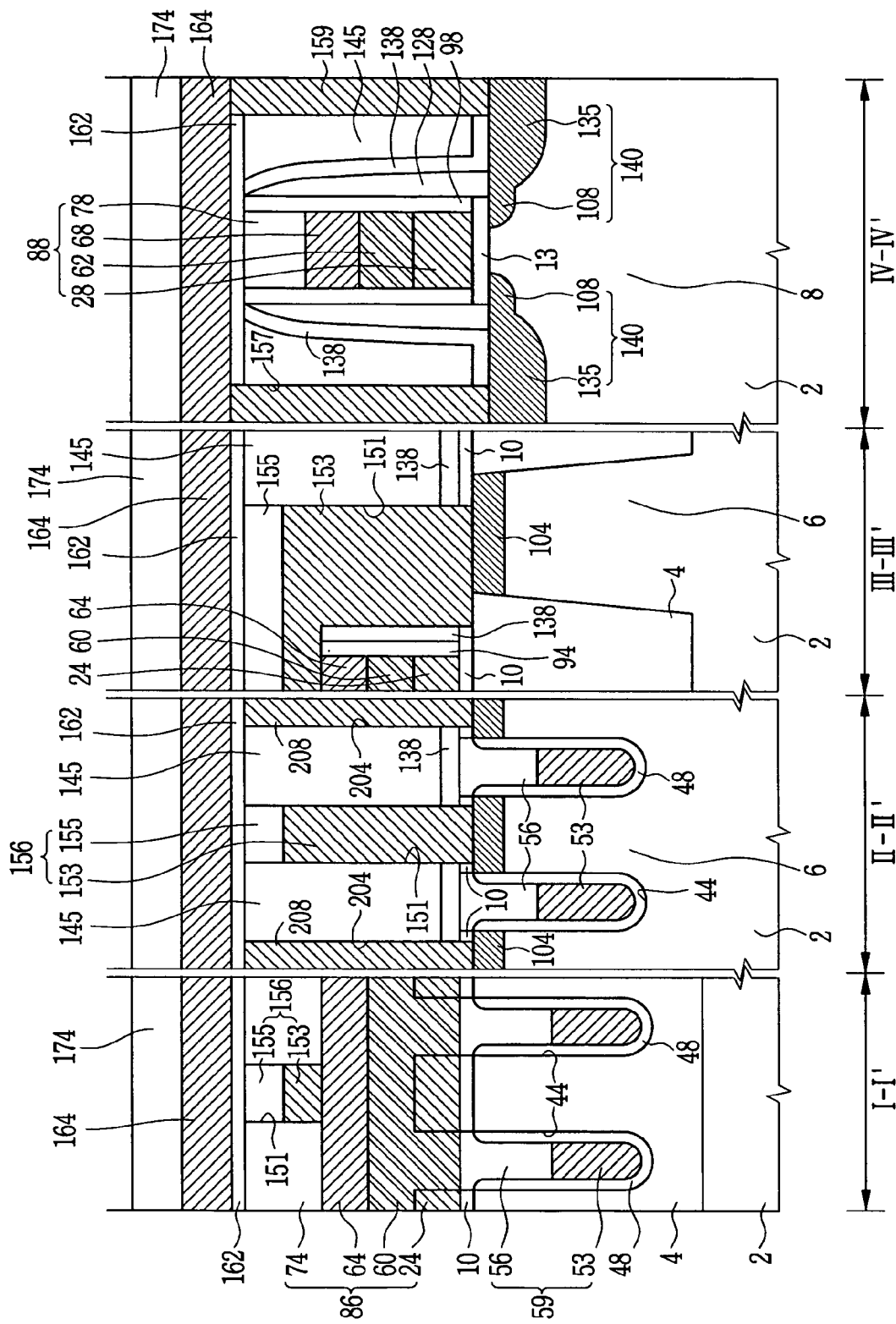
Figure 11:
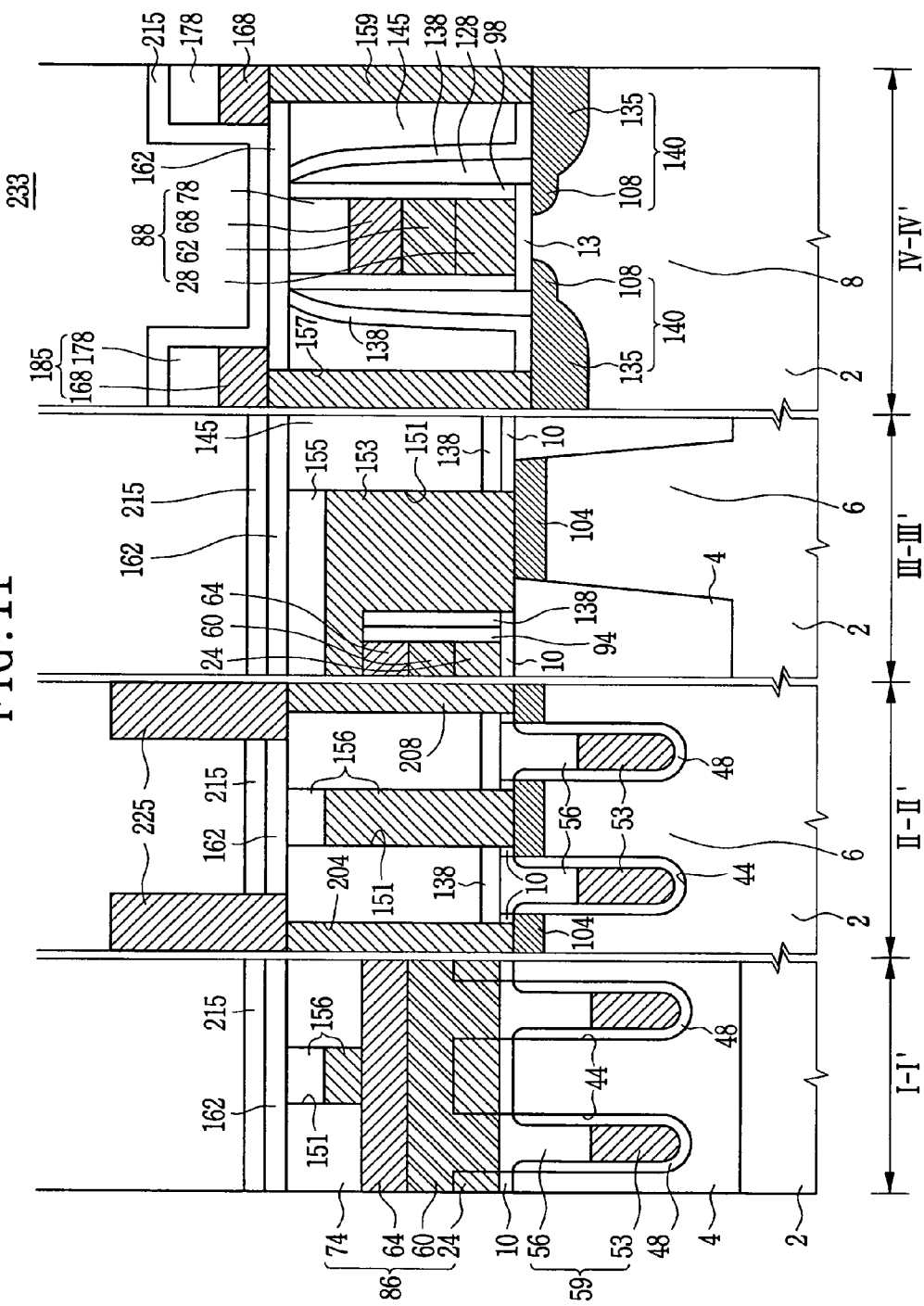

FIGS. 9 through 11 are cross-sectional views taken along lines I-I', II-II', III-III', and IV-IV' of FIG. 1, illustrating a method of forming a semiconductor device according to example embodiments. In FIGS. 9 through 11, the same reference numerals are used to denote the same elements as in FIGS. 5 through 8.

Referring to FIG. 9, according to example embodiments, a cell gate capping layer may be formed on the cell gates 53 of FIG. 6 to cover the mask capping layer 30 of FIG. 5. The cell gate capping layer and the mask capping layer 30 may be sequentially etched to expose the mask conductive layer 20 of FIG. 5, thereby forming cell gate capping patterns 56 as shown in the cross-sectional views taken along lines I-I' and II-II' of FIG. 9. The cell gate capping patterns 56 may be formed in a cell active region 6 to fill trenches 44. Also, the cell gate capping patterns 56 may be formed to have top surfaces at substantially the same level as a top surface of a pad layer 10.

Referring to the cross-sectional view showing cross-sections taken along line II-II', the cell gate capping patterns 56 may have the same shape as shown in the cross-section taken along line I-I'. The cell gate capping patterns 56 may constitute cell gate patterns 59 along with the cell gates. 53. Although not shown, a lower base conductive layer, an upper base conductive layer, and a base capping layer may be sequentially formed on the mask conductive layer 20. The lower base conductive layer may be formed on the capping pattern 56 to cover the mask conductive layer 20.

The lower base conductive layer may be formed of the same material as the mask conductive layer 20. The upper base conductive layer may include conductive material. For example, the upper base conductive layer may include a barrier metal layer and a tungsten layer that are stacked sequentially. The barrier metal layer may include metal and/or metal nitride to prevent diffusion of tungsten atoms. The base capping layer may include insulating material, for example, silicon nitride. Photoresist patterns may be formed on the base capping layer. The photoresist patterns may be formed in a cell array region C1 and a peripheral circuit region P.

The photoresist pattern of the cell array region C1 may be formed on an inactive region 4 adjacent to the cell active region 6. The photoresist pattern of the peripheral circuit region P may be formed on a peripheral active region 8 and the inactive region 4 disposed adjacent to the peripheral active region 8. The base capping layer, the upper base conductive layer, the lower base conductive layer, and the mask conductive layer 20 of FIG. 5 may be sequentially etched using the photoresist patterns as an etch mask, thereby forming the cell bit line pattern 86 and the peripheral gate pattern 88. The cell bit line pattern 86 may be formed on the inactive region 4 adjacent to the cell active region 6, as shown in FIG. 1.

As shown in the cross-section taken along line II-II', the cell bit line pattern 86 may be formed to expose the pad layer 10. Unlike FIG. 6, a top surface of the cell gate capping pattern 56 may not have a step difference. The cell bit line pattern 86 may be replaced with the cell bit line pattern 89 of FIG. 2 or 3. The peripheral gate pattern 88 may be formed on the peripheral active region 8 of the peripheral circuit region P and on the inactive region 4 disposed adjacent to the peripheral active region 8. The peripheral gate pattern 88 may be formed to expose the peripheral gate insulating layer 11 of FIG. 5.

The cell bit line pattern 86 may include the cell lower bit line 24, a cell intermediate bit line 60, the cell upper bit line 64, and the cell bit line capping pattern 74 which are stacked sequentially. The peripheral gate pattern 88 may include the peripheral lower gate 28, a peripheral intermediate gate 62, the peripheral upper gate 68, and the peripheral gate capping pattern 78, which are stacked sequentially. After forming the cell bit line pattern 86 and the peripheral gate pattern 88, the photoresist patterns may be removed from the semiconductor substrate 2.

A lower spacer layer may be formed on the pad layer 10 and the peripheral gate insulating layer 11 to cover the cell bit line pattern 86 and the peripheral gate pattern 88. The lower spacer layer may be etched so that bit line spacers 94 may be formed on sidewalls of the cell bit line pattern 86, and lower gate spacers 98 may be formed on sidewalls of the peripheral gate pattern 88. The bit line spacers 94 may be formed to expose the pad layer 10.

The lower gate spacers 98 may be formed to expose the peripheral active region 8. Subsequently, cell impurity regions 104 may be formed in the cell active region 6, while first peripheral impurity regions 108 may be formed in the peripheral active region 8. The cell impurity regions 104 may be formed using impurity ions between the cell gate patterns 59. The first peripheral impurity regions 108 may be formed using impurity ions to overlap the peripheral gate pattern 88.

An upper spacer layer 124 may be formed in the cell array region C1 and the peripheral circuit region P to cover the cell bit line pattern 86 and the peripheral gate pattern 88. The upper spacer layer 124 may be formed on the cell bit line patterns 86 to sufficiently fill spaces between the cell bit line patterns 86 in the cell array region C1 of FIG. 1. Alternatively, the upper spacer layer 124 may conformably cover the peripheral gate pattern 88 and the lower gate spacers 98 in the peripheral circuit region P.

The upper spacer layer 124 may be etched, thereby forming upper gate spacers 128 on the lower gate spacers 98. Through use of the peripheral gate pattern 88 and the lower and upper gate spacers 98 and 128 as an ion implantation mask, second peripheral impurity regions 135 may be formed in the peripheral active region 8. The second peripheral impurity regions 135 may be formed using impurity ions to overlap the lower gate spacers 98 and/or the upper gate spacers 128.

The first and second peripheral impurity regions 108 and 135 may constitute peripheral impurity regions 140. A photoresist layer may be formed in the peripheral circuit region P to cover the peripheral gate pattern 88 and the lower and upper gate spacers 98 and 128. The photoresist layer may be formed to expose the cell array region C1.

The upper spacer layer 124 may be removed from the semiconductor substrate 2 using the photoresist layer as an etch mask and using the cell bit line pattern 86, the bit line spacers 94, and the pad layer 10 as an etch buffer layer. After removing the upper spacer layer 124, the photoresist layer may be removed from the semiconductor substrate 2.

Referring to FIG. 10, according to example embodiments, an etch stop layer 138 and a lower interlayer insulating layer 145 may be sequentially formed in the cell array region C1 and the peripheral circuit region P to cover the cell bit line pattern 86 and the peripheral gate pattern 88. The etch stop layer 138 and the lower interlayer insulating layer 145 may be sequentially etched to expose the cell bit line pattern 86 and the peripheral gate pattern 88. Afterwards, a photoresist layer may be formed on the etch stop layer 138 and the lower interlayer insulating layer 145.

The photoresist layer may have an opening exposing the lower interlayer insulating layer 145 of the cell array region C1. The opening may be formed between the cell gate patterns 59. The lower interlayer insulating layer 145, the etch stop layer 138, the cell bit line capping pattern 74, and the pad layer 10 may be sequentially etched using the photoresist layer as an etch mask, thereby forming a cell contact hole 151. As shown in the cross-sectional views taken along lines I-I', II-II', and III-III', the cell contact hole 151 may be formed to expose the cell active region 6, the inactive region 4 disposed adjacent to the cell active region 6, and the cell bit line pattern 86.

In this case, the cell contact hole 151 may be formed to penetrate the cell bit line capping pattern 74 in an upper portion of the cell bit line pattern 86 and expose the cell upper bit line 64, the bit line spacer 94, and the etch stop layer 138. Also, the cell contact hole 151 may be formed to expose the etch stop layer 138 on a lateral side of the cell bit line pattern 86. After forming the cell contact hole 151, the photoresist layer may be removed from the semiconductor substrate 2. The contact plug 153 and a capping plug 155 may be sequentially formed to fill the cell contact hole 151.

The contact plug 153 may include conductive material. For example, the contact plug 153 may include a barrier metal layer and a tungsten layer that are stacked sequentially. The barrier metal layer may be formed of the same material as the barrier metal layer of the upper base layer of FIG. 9. The capping plug 155 may include insulating material, for example, silicon nitride. The capping plug 155 may prevent the contact plug 153 from electrically contacting subsequent components. The contact plug 153 and the capping plug 155 may constitute a cell contact plug 156.

Thereafter, a photoresist layer may be formed on the etch stop layer 138 and the lower interlayer insulating layer 145 to cover the cell contact plug 156. The photoresist layer may be formed to have openings aligned with the cell active region 6 in the cell array region C1. The lower interlayer insulating layer 145, the etch stop layer 138, and the pad layer 10 may be sequentially etched using the photoresist layer as an etch mask, thereby forming node contact holes 204. The node contact holes 204 may be formed to expose the cell active region 6 as shown in the cross-section taken along line II-II'.

After forming the node contact holes 204, the photoresist layer may be removed from the semiconductor substrate 2. Node plugs 208 may be formed in the node contact holes 204. The node plugs 208 may include conductive material, for example, doped poly-Si. The node plugs 208 may have top surfaces at substantially the same level as top surfaces of the cell bit line pattern 86, the peripheral gate pattern 88, and the cell contact plug 156. An interlayer buffer layer 162 may be formed on the etch stop layer 138 and the lower interlayer insulating layer 145 to cover the cell bit line pattern 86, the peripheral gate pattern 88, the cell contact plug 156, and the node plugs 208.

The interlayer buffer layer 162 may include insulating material, for example, silicon oxide. The interlayer buffer layer 162 may be formed in the cell array region C1 and the peripheral circuit region P. A photoresist layer may be formed on the interlayer buffer layer 162. The photoresist layer may be formed to have openings exposing the interlayer buffer layer 162 in the peripheral circuit region P. The openings of the photoresist layer may be aligned with lateral portions of the peripheral gate patterns 88. The interlayer buffer layer 162, the lower interlayer insulating layer 145, and the etch stop layer 138 may be sequentially etched using the photoresist layer as an etch mask, thereby forming a peripheral contact hole 157.

The peripheral contact holes 157 may be formed to expose the peripheral active region 8 as shown in the cross-section taken along line IV-IV'. After forming the peripheral contact holes 157, the photoresist layer may be removed from the semiconductor substrate 2. Peripheral contact plugs 159 may be formed to fill the peripheral contact holes 157. The peripheral contact plugs 159 may include the same material as the contact plug 153. The peripheral contact plugs 159 may not have top surfaces at the same level as top surfaces of the cell bit line pattern 86, the peripheral gate pattern 88, the cell contact plugs 156, and the node plug 208.

An interconnection layer 164 and an interconnection capping layer 174 may be formed on the interlayer buffer layer 162 to cover the peripheral contact plugs 159. The interconnection layer 164 may include the same material as the peripheral contact plug 159. The interconnection capping layer 174 may include insulating material, for example, silicon nitride.

Referring to FIG. 11, according to example embodiments, photoresist patterns may be formed on the interconnection capping layer 174 of FIG. 10. The interconnection capping layer 174 and the interconnection layer 164 may be sequentially etched using the photoresist patterns as an etch mask, thereby forming peripheral bit line patterns 185 in the peripheral circuit region P. The peripheral bit line patterns 185 may be formed to expose the interlayer buffer layer 162. The peripheral bit line patterns 185 may include a peripheral bit line 168 and a peripheral bit line capping pattern 178. After forming the peripheral bit line patterns 185, the photoresist patterns may be removed from the semiconductor substrate 2.

Thereafter, the protection layer 215 may be formed on the interlayer buffer layer 162 to cover the peripheral bit line pattern 185. Storage nodes 225 may be formed to sequentially penetrate the protection layer 215 and the interlayer buffer layer 162 and contact the node plugs 208. Subsequently, the upper interlayer insulating layer 195 of FIG. 8 may be formed on the storage nodes 225 and/or the peripheral bit line patterns 185. As a result, the storage nodes 225 may constitute the semiconductor device 233 along with the cell gate patterns 59, the cell bit line pattern 86, the peripheral gate pattern 88, and the peripheral bit line patterns 185. Also, the semiconductor device 233 may be replaced with the semiconductor device 236 of FIG. 2 or the semiconductor device 239 of FIG. 3.

As described above, example embodiments may provide a semiconductor device in which a cell bit line pattern and a peripheral gate pattern are formed of the same material on a semiconductor substrate so that, despite the shrinkage of design rules, a semiconductor fabrication process may be performed under better circumstances than in the conventional art.

Also, the cell bit line pattern and a cell contact plug may not be stacked, but may be disposed at the same level to contact each other. As a result, as compared with the conventional art, the semiconductor device may reduce a parasitic capacitance between the cell bit line pattern and the cell contact plug and a parasitic capacitance between the cell bit line pattern and components disposed adjacent to the cell contact plug.

In addition, since a peripheral bit line pattern is formed on the cell bit line pattern and the peripheral gate pattern, an occupancy ratio of components on the semiconductor substrate may be increased so that a process margin may be increased even in reduced design rules.

Furthermore, insulating material may be formed on the cell bit line pattern and the cell contact plug, which contact each other at the same level, and components disposed adjacent to the cell contact plug, so that an electrical short-circuit between the cell bit line pattern, the cell contact plug, and the components disposed adjacent to the cell contact plug may be prevented more effectively.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
an inactive region configured to define first and second active regions in a semiconductor substrate;
a first upper interconnection disposed on the inactive region adjacent to the first active region;
a first contact plug configured to have a top surface at a same level as a top surface of the first upper interconnection and contact the first active region and the first upper interconnection;
a second lower interconnection configured to have a top surface disposed at the same level as the top surface of the first contact plug and disposed on the second active region;
a second upper interconnection disposed on the second lower interconnection; and
a second contact plug configured to contact the second upper interconnection and the second active region.

2. The device as claimed in claim 1, wherein the first and second upper interconnections have different structures and include bit lines.

3. The device as claimed in claim 2, further comprising a first lower interconnection configured to intersect the second upper interconnection,
wherein the first lower interconnection protrudes upward from a top surface of the semiconductor substrate and extends downward from the top surface of the semiconductor substrate.

4. The device as claimed in claim 3, wherein:
the first and second lower interconnections have different structures and include gates,
the first lower interconnection has a top surface that is substantially planar across the first active region and the inactive region or has a higher top surface in the inactive region than in the first active region, and
the second lower interconnection is formed of the same material as the first upper interconnection.

5. The device as claimed in claim 4, wherein the first lower and upper interconnections electrically interact with each other through the first active region and the first contact plug, and the second lower and upper interconnections electrically interact with each other through the second active region and the second contact plug.

6. The device as claimed in claim 5, wherein the first and second contact plugs have the same structure and the second contact plug has a top surface at the same level as the top surface of the second lower interconnection.

7. The device as claimed in claim 5, wherein a first end of the first contact plug is inserted into an upper portion of the first upper interconnection, and a second end of the first contact plug contacts the first active region and the inactive region disposed adjacent to the first active region.

8. The device as claimed in claim 7, further comprising first and second gate spacers sequentially stacked on each of both sidewalls of the second lower interconnection.

9. The device as claimed in claim 8, wherein the first upper interconnection is disposed parallel to the first active region and at a right angle to the first lower interconnection.

10. The device as claimed in claim 8, wherein the first upper interconnection is disposed parallel to the first active region and oblique to the first lower interconnection.

11. A semiconductor device, comprising:
inactive regions disposed in a cell array region and a peripheral circuit region of a semiconductor substrate;
cell and peripheral active regions defined by the inactive regions in the cell array region and the peripheral circuit region;
a first interconnection, a second interconnection, and a cell contact plug disposed in the cell array region, wherein the first interconnection is disposed on the cell active region and the inactive region disposed adjacent to the cell active region, the second interconnection is disposed on the inactive region adjacent to the cell active region and configured to intersect the first interconnection, and the cell contact plug is configured to have a top surface at substantially a same level as a top surface of the second interconnection and contacts the cell active region and the second interconnection; and
a third interconnection, a fourth interconnection, and a peripheral contact plug disposed in the peripheral circuit region, wherein the third interconnection is disposed on the peripheral active region, formed of the same material as the second interconnection, and configured to have a top surface at the same level as the top surface of the cell contact plug, the fourth interconnection is disposed on the third interconnection, and the peripheral contact plug is configured to contact the peripheral active region and the fourth interconnection,
wherein the first interconnection is partially inserted into the second interconnection across the second interconnection or contacts the second interconnection under the second interconnection across the second interconnection.

12. The device as claimed in claim 11, wherein the first and third interconnections are disposed at different levels on the semiconductor substrate and have gates with different structures, the second and fourth interconnections are disposed at different levels on the semiconductor substrate and have bit lines with different structures, and the second and third interconnections are formed of the same material.

13. The device as claimed in claim 12, wherein the cell and peripheral contact plugs have the same structure and the peripheral contact plug has a top surface at the same level as the top surface of the third interconnection.

14. The device as claimed in claim 12, wherein the second interconnection is disposed parallel to the cell active region and at a right angle to the first interconnection.

15. The device as claimed in claim 12, wherein the second interconnection includes two lines defining an inflection point, the cell active region is disposed parallel to the respective two lines of the second interconnection, and the first interconnection is disposed oblique to the cell active region and the second interconnection.

16. The device as claimed in claim 12, wherein the second interconnection includes two lines defining an inflection point, the cell active region has a center corresponding to the inflection point between the two lines of the second interconnection and is disposed parallel to the two lines of the second interconnection, and the first interconnection is disposed oblique to the cell active region and the second interconnection.

* * * * *

UNITED STATES PATENT AND TRADEMARK OFFICE
CERTIFICATE OF CORRECTION

PATENT NO. : 8,120,123 B2
APPLICATION NO. : 12/662150
DATED : February 21, 2012
INVENTOR(S) : Makoto Yoshida et al.

It is certified that error appears in the above-identified patent and that said Letters Patent is hereby corrected as shown below:

Title Page, Item [75]

Delete Inventors: "DAE-IK KIM
 YONG-IL KIM"

Signed and Sealed this
Eleventh Day of December, 2012

David J. Kappos
*Director of the United States Patent and Trademark Office*